US012578393B2

(12) United States Patent
Shu et al.

(10) Patent No.: US 12,578,393 B2
(45) Date of Patent: Mar. 17, 2026

(54) BATTERY CAPACITY ESTIMATION METHOD AND APPARATUS, AND COMPUTER STORAGE MEDIUM

(71) Applicant: BYD COMPANY LIMITED, Shenzhen (CN)

(72) Inventors: Shiwei Shu, Shenzhen (CN); Tianyu Feng, Shenzhen (CN); Linwang Deng, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 183 days.

(21) Appl. No.: 18/610,753

(22) Filed: Mar. 20, 2024

(65) Prior Publication Data

US 2024/0230771 A1     Jul. 11, 2024

Related U.S. Application Data

(63) Continuation of application No. PCT/CN2022/118754, filed on Sep. 14, 2022.

(30) Foreign Application Priority Data

Nov. 26, 2021    (CN) .......................... 202111422355.6

(51) Int. Cl.
G01R 31/3835        (2019.01)
G01R 31/392         (2019.01)
                    (Continued)

(52) U.S. Cl.
CPC ....... *G01R 31/3835* (2019.01); *G01R 31/392* (2019.01); *H01M 10/44* (2013.01);
                    (Continued)

(58) Field of Classification Search
None
See application file for complete search history.

(56) References Cited

U.S. PATENT DOCUMENTS

2011/0012604 A1* 1/2011 Tsujiko ............... H01M 4/5825
                                                    324/427
2012/0176092 A1   7/2012 Fujii et al.
                        (Continued)

FOREIGN PATENT DOCUMENTS

CN        101981750 A      2/2011
CN        102590754 A      7/2012
                    (Continued)

OTHER PUBLICATIONS

International Search Report and Written Opinion for Application No. PCT/CN2022/118754, mailed on Dec. 16, 2022, 12 pages.
                    (Continued)

*Primary Examiner* — Jas A Sanghera
(74) *Attorney, Agent, or Firm* — Sheppard Mullin Richter & Hampton LLP

(57)                ABSTRACT

A method of obtaining battery capacity, includes: acquiring a voltage-capacity curve of a battery; performing differentiation on the voltage-capacity curve to obtain a voltage differential-capacity curve; identifying wave crests in the voltage differential-capacity curve; calculating heights and widths between each wave crest and the adjacent wave trough on the left and the right; calculating a determination index p according to the heights and the widths; determining a voltage knee point in the voltage-capacity curve according to a wave crest with a minimum determination index; acquiring a reference capacity value corresponding to the voltage knee point in the voltage-capacity curve; after the battery reaches a full-charge state, acquiring charging electric energy of the battery for charging from the voltage knee point to the full-charge state; and obtaining a capacity of the battery based on a sum of the reference capacity value and the charging electric energy.

20 Claims, 2 Drawing Sheets

S110 — Acquire a voltage-capacity curve of a battery in real time in a battery charging process S120 — Perform differentiation on the voltage-capacity curve to obtain a voltage differential-capacity curve S130 — Identify multiple wave crests in the voltage differential-capacity curve S140 — Calculate a first height and a first width between each wave crest and an adjacent wave trough on the left, and a second height and a second width between each wave crest and an adjacent wave trough on the right S150 — Calculate a determination index according to the first height, the first width, the second height, and the second width, where p=2(h1+w1)/(h1-w1)+2(h2+w2)/(h2-w2), p represents the determination index, h1 represents the first height, w1 represents the first width, h2 represents the second height, and w2 represents the second width S160 — Determine a voltage knee point in the voltage-capacity curve according to a wave crest with a minimum determination index S170 — Acquire a pre-calibrated reference capacity value corresponding to the voltage knee point in the voltage-capacity curve S180 — After the battery reaches a full-charge state, acquire charging electric quantity of the battery from the voltage knee point to the full-charge state S190 — Obtain an actual capacity of the battery based on a sum of the reference capacity value and the charging electric quantity

(51) Int. Cl.

| | |
|---|---|
| *H01M 10/44* | (2006.01) |
| *H02J 7/00* | (2006.01) |
| *H01M 10/0525* | (2010.01) |

(52) U.S. Cl.

CPC ............ *H02J 7/0049* (2020.01); *H02J 7/005* (2020.01); *H01M 10/0525* (2013.01); *H01M 2220/20* (2013.01)

(56) References Cited

U.S. PATENT DOCUMENTS

| | | | |
|---|---|---|---|
| 2013/0314050 | A1 | 11/2013 | Matsubara et al. |
| 2021/0018568 | A1 | 1/2021 | Deng et al. |

FOREIGN PATENT DOCUMENTS

| | | | |
|---|---|---|---|
| CN | 104931882 | A | 9/2015 |
| CN | 108008183 | A | 5/2018 |
| CN | 108226783 | A | 6/2018 |
| CN | 110320477 | A | 10/2019 |
| CN | 110546522 | A | 12/2019 |
| CN | 110549909 | A | 12/2019 |
| CN | 110549909 | B | 12/2019 |
| CN | 111551868 | A | 8/2020 |
| CN | 112578296 | A | 3/2021 |
| EP | 2610629 | A1 | 7/2013 |
| JP | H06342044 | A | 12/1994 |
| JP | 2012145403 | A | 8/2012 |
| JP | 2019056595 | A | 4/2019 |
| JP | 2021150076 | A | 9/2021 |
| KR | 10-2007-0097093 | A | 10/2007 |
| KR | 10-2015-0048439 | A | 5/2015 |
| KR | 101930646 | B1 | 3/2019 |
| KR | 10-2020-0078227 | A | 7/2020 |
| WO | 2013157132 | A1 | 10/2013 |
| WO | 2019069435 | A1 | 4/2019 |
| WO | 2019098576 | A1 | 5/2019 |
| WO | 2020026058 | A1 | 2/2020 |

OTHER PUBLICATIONS

Examination Report No. 1 dated Jan. 2, 2025, issued in Australian Patent Application No. 2022397745 (4 pages).

Office Action dated Mar. 13, 2025, issued in Canadian Patent Application No. 3,232,287 (3 pages).

Extended European Search Report dated Nov. 25, 2024, issued in European Patent Application No. 22897312.9 (5 pages).

Notice of Reasons for Refusal dated Apr. 1, 2025, issued in Japanese Patent Application No. 2024-510620, with English machine translation (4 pages).

Request for the Submission of an Opinion dated May 26, 2025, issued in Korean Patent Application No. 10-2024-7008537, with English machine translation (20 pages).

\* cited by examiner

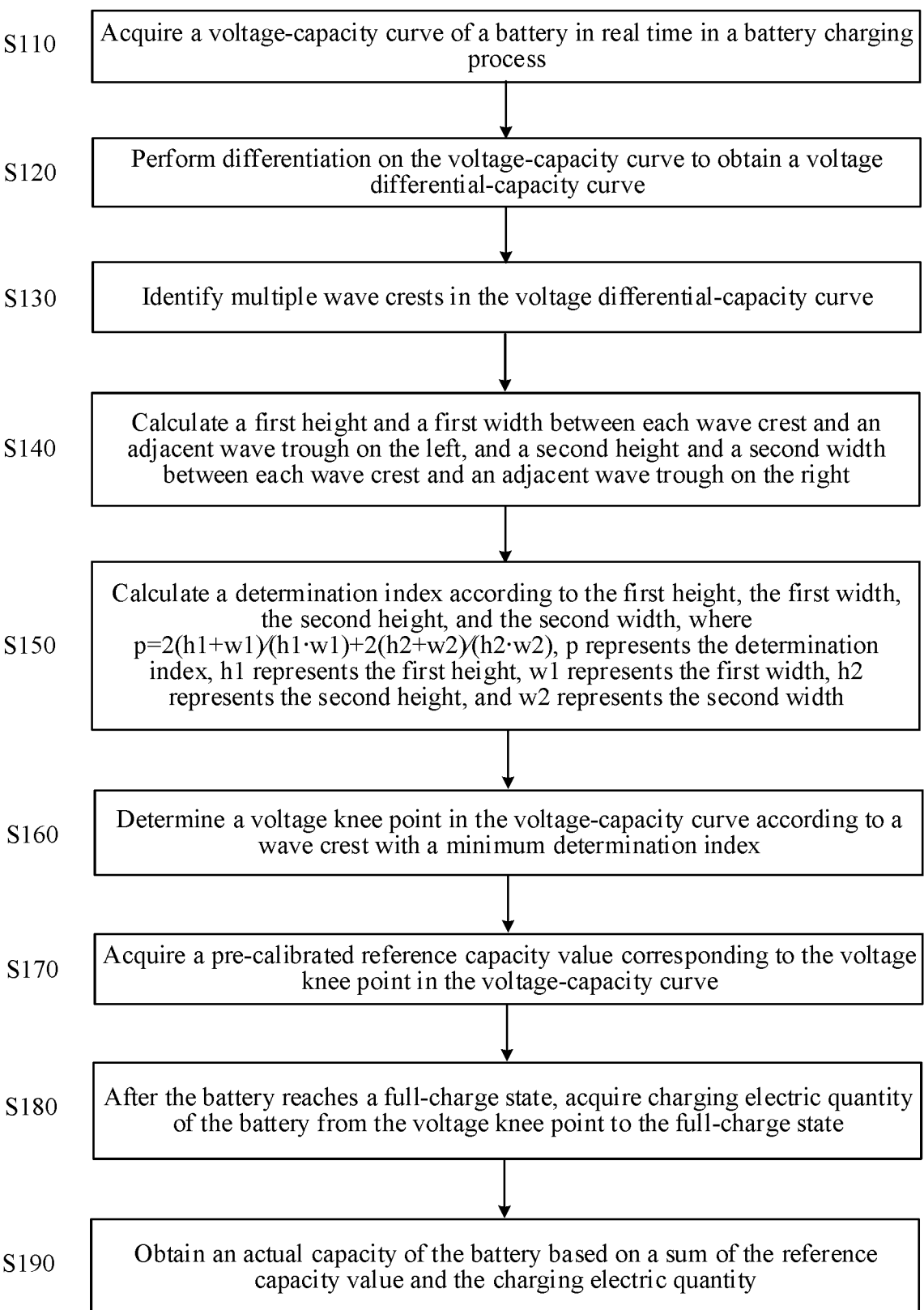

S110 — Acquire a voltage-capacity curve of a battery in real time in a battery charging process S120 — Perform differentiation on the voltage-capacity curve to obtain a voltage differential-capacity curve S130 — Identify multiple wave crests in the voltage differential-capacity curve S140 — Calculate a first height and a first width between each wave crest and an adjacent wave trough on the left, and a second height and a second width between each wave crest and an adjacent wave trough on the right S150 — Calculate a determination index according to the first height, the first width, the second height, and the second width, where p=2(h1+w1)/(h1·w1)+2(h2+w2)/(h2·w2), p represents the determination index, h1 represents the first height, w1 represents the first width, h2 represents the second height, and w2 represents the second width S160 — Determine a voltage knee point in the voltage-capacity curve according to a wave crest with a minimum determination index S170 — Acquire a pre-calibrated reference capacity value corresponding to the voltage knee point in the voltage-capacity curve S180 — After the battery reaches a full-charge state, acquire charging electric quantity of the battery from the voltage knee point to the full-charge state S190 — Obtain an actual capacity of the battery based on a sum of the reference capacity value and the charging electric quantity

FIG. 1

BATTERY CAPACITY ESTIMATION METHOD AND APPARATUS, AND COMPUTER STORAGE MEDIUM

CROSS-REFERENCE TO RELATED APPLICATIONS

The application is a continuation application of International Patent Application No. PCT/CN2022/118754 filed on Sep. 14, 2022, which is based on and claims priority to and benefits of Chinese patent application Ser. No. 202111422355.6, filed on Nov. 26, 2021. The entire content of all of the above-referenced applications is incorporated herein by reference.

FIELD

The present disclosure relates to the technical field of battery management, and more particularly to a battery capacity estimation method and apparatus, and a computer storage medium.

BACKGROUND

The strong demand of people for new renewable energy solutions, such as electric vehicles, electric aircraft, and electric ships, has led to the rapid development of lithium-ion batteries. The batteries applied in the above systems will face more severe working conditions including higher power and energy demands, as well as greater temperature changes, all of which accelerate battery aging. Therefore, it is necessary to track the State Of Health (SOH) of the battery and determine when the battery's lifespan ends. SOH is usually defined as the ratio between the actual capacity of the battery and the initial capacity of the battery at a given time.

At present, when calculating the battery capacity, the main method is implemented by calculating the total electric energy during the charging or discharging stage by fully charging and discharging the battery, or by charging and discharging within a certain State of Charge (SOC) range of the battery, and calculating the total battery capacity based on the charging or discharging electric energy and the corresponding SOC range. The estimation accuracy in this method depends entirely on the accuracy of SOC. If there is a significant error in SOC estimation, it will affect the battery capacity estimation accuracy. Especially for lithium iron phosphate batteries, the cumulative error of SOC will affect the accuracy of battery capacity. However, the error of the battery capacity can in turn affect the accuracy of SOC, leading to cross effects and ultimately rendering the estimation of battery capacity completely ineffective.

If laboratory benchmarking methods are adopted, there are two drawbacks: 1: laboratory testing is very time-consuming, labor-intensive, and expensive, and cannot cover all working conditions; and 2: benchmarking against laboratory data in practical use would be too dogmatic and unable to estimate the actual battery capacity.

Incorrect battery capacity information may affect a user's decision to replace battery and start or stop charging the battery.

SUMMARY

A series of concepts in a simplified form are further described in detail in the embodiments. The present disclosure is not to limit the key features and necessary technical features of the claimed technical solution, nor is it to determine the protection scope of the claimed technical solution.

In order to solve the above technical problem, in a first aspect, an embodiment of the present disclosure provides a method of obtaining battery capacity, including: acquiring a voltage-capacity curve of a battery in a battery charging process; performing differentiation on the voltage-capacity curve to obtain a voltage differential-capacity curve; identifying a plurality of wave crests in the voltage differential-capacity curve; for each of the wave crests, calculating a first height and a first width between the wave crest and an adjacent wave trough on the left, and calculating a second height and a second width between the wave crest and an adjacent wave trough on the right; calculating a determination index p according to the first height, the first width, the second height, and the second width, wherein $p=2(h1+w1)/(h1\cdot w1)+2(h2+w2)/(h2\cdot w2)$, where h1 represents the first height, w1 represents the first width, h2 represents the second height, and w2 represents the second width; determining a voltage knee point in the voltage-capacity curve according to a wave crest with a minimum determination index; acquiring a reference capacity value corresponding to the voltage knee point in the voltage-capacity curve; after the battery reaches a full-charge state, acquiring charging electric energy of the battery for charging from the voltage knee point to the full-charge state; and obtaining a capacity of the battery based on a sum of the reference capacity value and the charging electric energy.

According to the present disclosure, the capacity of the battery is estimated/obtained according to the voltage knee point on the voltage-capacity curve in the battery charging process, the accuracy of the battery capacity may be improved, the battery does not need to be emptied or fully discharged, and the using habit of a user is met.

In an embodiment, before the performing differentiation on the voltage-capacity curve, the method further includes performing smoothing filtering on the voltage-capacity curve.

In an embodiment, the reference capacity value is calibrated by: after discharging the battery to empty, performing constant-current charging process until the battery reaching the full-charge state, recording a voltage-capacity curve of the battery in the constant-current charging process, and calibrating the reference capacity value according to the voltage-capacity curve of the battery in the constant-current charging process.

In an embodiment, the acquiring charging electric energy of the battery for charging from the voltage knee point to the full-charge state includes: recording a charging time for charging the battery from the voltage knee point to the full-charge state; and calculating the charging electric energy according to the charging time and a charging current.

In an embodiment, the method further includes: obtaining a state of health of the battery according to the capacity of the battery and an initial capacity of the battery.

In an embodiment, the battery is a lithium iron phosphate battery.

In an embodiment, the initial capacity of the battery is determined by: after discharging the battery to empty, performing constant-current charging process until the battery reaching the full-charge state; and recording the initial capacity of the battery.

In an embodiment, the state of health of the battery according to the capacity of the battery and the initial capacity of the battery is obtained according to: SOH=Q/$Q_{new}$*100%, wherein SOH represents the state of health of the battery, Q represents the capacity of the battery, $Q_{new}$ represents the initial capacity of the battery.

In a second aspect, an embodiment of the present disclosure provides an apparatus of obtaining battery capacity, including a memory and a processor. The memory stores a computer program executable by the processor, and the processor is configured to execute the computer program to implement the method of obtaining battery capacity of the first aspect.

In a third aspect, an embodiment of the present disclosure provides a non-transitory computer-readable storage medium storing a computer program, which when executed by a processor, causes the processor to implement the method of obtaining battery capacity of the first aspect.

According to the battery capacity estimation method and apparatus provided by this embodiment of the present disclosure, the capacity of the battery is estimated according to the voltage knee point on the voltage-capacity curve in the battery charging process, and the absolute value of SOC is not involved. Therefore, the estimation accuracy of the battery capacity may be improved, the battery does not need to be emptied, and the using habit of the user is met.

BRIEF DESCRIPTION OF THE DRAWINGS

The above and other objects, features and advantages of the present disclosure will become more apparent through a more detailed description of the embodiments of the present disclosure in conjunction with the accompanying drawings. The accompanying drawings are used for providing further understanding of the embodiments of the present disclosure, and constitute a part of the description. They are used for explaining the present disclosure together with the embodiments of the present disclosure, and do not constitute a limitation of the present disclosure. In the accompanying drawings, same reference numerals generally represent same components or steps.

FIG. 1 is a schematic flowchart of a battery capacity estimation method according to an embodiment of the present disclosure;

DETAILED DESCRIPTION

Figure 2:
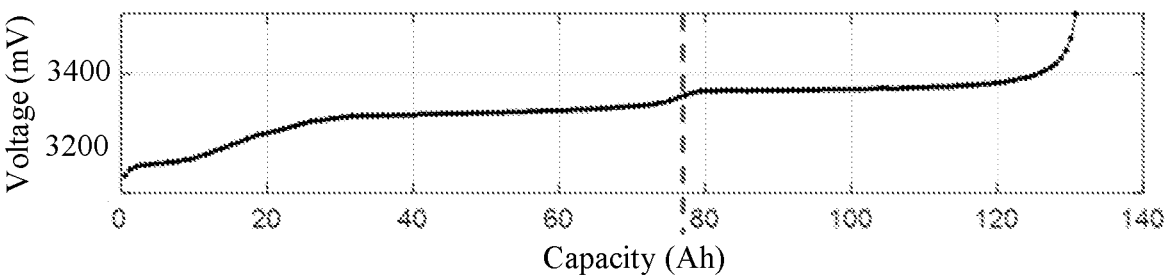
FIG. 2 is a schematic diagram of a voltage-capacity curve according to an embodiment of the present disclosure.

In order to make the purpose, technical solution, and advantages of the present disclosure more obvious, the following will refer to the accompanying drawings to describe in detail the embodiments according to the present disclosure. Apparently, the described embodiments are merely some but not all of the embodiments of the present disclosure. It should be understood that, the present disclosure is not limited by the embodiments described herein. Based on the embodiments in the present disclosure, all the other embodiments obtained by those skilled in the art without making any creative work fall within the scope of protection of the present disclosure.

In the following description, numerous details are given to facilitate a more thorough understanding of the present disclosure. However, it is obvious to those skilled in the art that the present disclosure can be implemented without one or more of these details. In other examples, to avoid confusion with the present disclosure, some technical features known in the art are not described.

It is to be understood that the present disclosure can be implemented in different forms and should not be construed as being limited to the embodiments presented herein. Conversely, these embodiments are provided for the purpose of making the disclosure thorough and complete, and conveying the scope of the present disclosure fully to those skilled in the art.

The terms are used herein merely for purpose of describing embodiments and not as a limitation of the present disclosure. When used herein, the singular forms "a", "an" and "the" are also meant to include the plural form, unless otherwise clearly indicated. It should also be understood that the terms "consisting of" and/or "including", when used in this specification, confirm the existence of the described features, integers, steps, operations, elements and/or components, but do not exclude the existence or addition of one or more other features, integers, steps, operations, elements, components and/or groups. As used herein, the term "and/or" includes any and all combinations of related listed items.

For the purpose of thoroughly understanding the present disclosure, a detailed structure will be presented in the following description to explain the technical solution proposed in the present disclosure. Some embodiments of the present disclosure are described in detail as follows. However, besides these detailed descriptions, the present disclosure may also have other implementations.

A battery capacity estimation method and a battery capacity estimation apparatus provided in the embodiments of the present disclosure will be described below with reference to the accompanying drawings. Referring to FIG. 1 first, FIG. 1 is a schematic flowchart of a battery capacity estimation method according to an embodiment of the present disclosure. As shown in FIG. 1, the battery capacity estimation method includes:

S110: A voltage-capacity curve of a battery is acquired in real time in a battery charging process.

S120: Differentiation is performed on the voltage-capacity curve to obtain a voltage differential-capacity curve.

S130: Multiple wave crests are identified in the voltage differential-capacity curve.

S140: A first height and a first width between each wave crest and an adjacent wave trough on the left, and a second height and a second width between each wave crest and an adjacent wave trough on the right are calculated.

S150: A determination index p is calculated according to the first height, the first width, the second height, and the second width, where $p=2(h1+w1)/(h1 \cdot w1)+2(h2+w2)/(h2 \cdot w2)$, p represents the determination index, h1 represents the first height, w1 represents the first width, h2 represents the second height, and w2 represents the second width.

S160: A voltage knee point in the voltage-capacity curve is determined according to a wave crest with a minimum determination index.

S170: A pre-calibrated reference capacity value corresponding to the voltage knee point in the voltage-capacity curve is acquired.

S180: After the battery reaches a full-charge state, charging electric energy of the battery for charging from the voltage knee point to the full-charge state is acquired.

S190: An actual capacity of the battery is obtained based on a sum of the reference capacity value and the charging electric energy.

According to the battery capacity estimation method in this embodiment of the present disclosure, the voltage-battery capacity curve is detected in real time in the battery charging process, curve characteristics are analyzed, the voltage knee point is identified, and then the actual capacity of the battery is estimated/obtained according to the voltage knee point. According to the method, the actual capacity of the battery is intelligently estimated according to the characteristic attributes of materials in the battery charging process, deep discharging does not need to be carried out on the battery, and the actual capacity of the battery may be accurately calculated under a condition that the initial SOC state of the battery is unknown. Moreover, the calculation process does not involve the absolute value of the SOC, so cross influence with the calculation of the SOC is avoided. According to the battery capacity estimation method in this embodiment of the present disclosure, the test cost of a laboratory can be greatly reduced, and the calculation efficiency and accuracy of the battery capacity may be remarkably improved. According to the present disclosure, the capacity of the battery is estimated according to the voltage knee point on the voltage-capacity curve in the battery charging process, the estimation accuracy of the battery capacity may be improved, the battery does not need to be emptied or fully discharged, and the using habit of the user may be met. Further, the user may use the accurate battery capacity to decide whether to have the battery replaced. For example, based on the obtained battery capacity, a vehicle may generate a recommendation to the user to replace or repair the battery.

In an embodiment, in the battery charging process, the voltage-capacity curve of the battery is acquired in real time, and the voltage knee point is determined in the voltage-capacity curve. The battery includes a lithium ion battery, and can be a lithium iron phosphate battery. The voltage knee point is one of multiple points with the fastest voltage change along with the capacity. The features of the voltage-capacity curve and the voltage knee point are described below with reference to FIG. 2 and FIG. 3.

Referring to FIG. 2 first, FIG. 2 shows a voltage-capacity curve of a lithium ion battery. Generally, there are three intervals where the voltage changes slowly with capacity in the voltage-capacity curve of lithium-ion battery, which are called voltage platform areas. There is an area where the voltage changes fast along with the capacity between every two adjacent voltage platform areas, and the point with the fastest voltage change in the area is called the voltage knee point. According to this embodiment of the present disclosure, the voltage knee point used for estimating/obtaining the SOH of the battery is between the second voltage platform area and the third voltage platform area, which is the point with the fastest voltage change along with the capacity in the interval.

Research shows that along with aging of the lithium ion battery, the capacity difference value between the battery capacity value corresponding to the voltage knee point and the battery capacity value corresponding to SOC=0 (namely the capacity value is 0) is kept unchanged. According to this embodiment of the present disclosure, the actual capacity of the battery is estimated according to this characteristic of the voltage knee point. After the actual capacity of the battery is estimated, the state of health (SOH) of the battery can be calculated according to the actual capacity of the battery, the SOH of the battery is the ratio of the actual capacity of the battery to the initial capacity of the battery, and the initial capacity of the battery can be obtained through calibration before delivery. In an embodiment, the battery can be subjected to constant-current charge to reach the full-charge state after the electric energy of the battery is emptied, and the initial capacity (recorded as $Q_{new}$) of the battery is recorded. According to this embodiment of the present disclosure, the actual capacity of the battery is calculated according to the characteristics of the voltage knee point, and the calculation of the actual capacity of the battery according to the SOC is avoided, so that the problems that the estimation accuracy of the SOH is influenced by the error accumulation of the SOC and the precision of the SOC is influenced by the error of the SOH are avoided.

In an embodiment, as mentioned above, as the battery capacity value corresponding to the voltage knee point remains unchanged, after the voltage knee point is identified according to the voltage-capacity curve in this embodiment of the present disclosure, the charging electric energy (recorded as QHVP) of the battery in the interval from the voltage knee point to full-charge state of the battery is calculated, and the charging electric energy and the capacity value (recorded as QHVTP) corresponding to the voltage knee point are summed, so that the actual capacity Q of the battery can be obtained, and Q=QHVP+QHVTP. The SOH of the battery is calculated according to the actual capacity Q of the battery and a pre-calibrated initial capacity $Q_{new}$, and SOH=$Q/Q_{new}$*100%.

The battery capacity in the voltage-capacity curve is calculated by a battery management system according to the SOC. In order to avoid the introduction of SOC errors, the actual capacity of the battery is calculated through the pre-calibrated reference capacity value corresponding to the voltage knee point in this embodiment of the present disclosure. In an embodiment, before the battery leaves a factory, the electric energy of the battery is emptied, and then the battery is subjected to constant-current charging to reach the full-charge state. The voltage-capacity curve is recorded in the battery charging process. The reference capacity value corresponding to the voltage knee point is determined through offline calibration by analyzing the characteristics of the voltage-capacity curve. When the charging electric energy between the voltage knee point and the full-charge state is calculated, the time for reaching the voltage knee point and the time for reaching the full-charge state can be recorded. Calculation is carried out according to the actual charging current and the time for charging the battery from the voltage knee point to the full-charge state. Because the reference capacity value corresponding to the voltage knee point is an accurate value, the charging electric energy is also an accurate value, and the accurate actual capacity of the battery may be obtained by summing the reference capacity value and the charging electric energy.

According to this embodiment of the present disclosure, the SOC absolute value is not involved in the process of estimating the actual capacity of the battery, so that the defect that the SOC estimation accuracy is excessively depended on when the actual capacity of the battery is calculated in a traditional mode may be avoided. Moreover, according to this embodiment of the present disclosure, the battery does not need to be emptied, and the using habit of a common user is met. The actual capacity of the battery can be accurately calculated when charging may be started with the SOC lower than 60%.

In an embodiment, the voltage knee point is the point with the fastest voltage change along with the capacity, so that the voltage knee point can be determined according to the voltage differential-capacity curve, and the voltage knee point corresponds to the wave crest of the voltage differential-capacity curve. In an embodiment, the voltage-capacity curve is subjected to differentiation to obtain a voltage differential-capacity (dV/dQ-Q) curve, and the capacity value corresponding to the voltage knee point is determined according to the wave crest of the voltage differential-capacity curve.

There are multiple wave crests generally in the voltage differential-capacity curve. In order to determine the voltage knee point, it is needed to determine a feature peak in the voltage differential-capacity curve, namely the wave crest corresponding to the voltage knee point. According to this embodiment of the present disclosure, the feature peak is identified according to the ratio of the perimeter to the area of each wave crest, and the voltage knee point determined according to the feature peak is the voltage knee point meeting the constant capacity characteristic.

Figure 3:
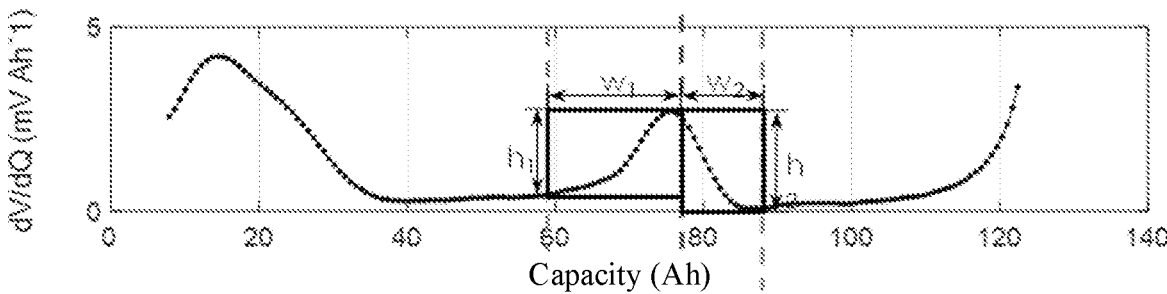
FIG. 3 is a schematic diagram of a voltage differential-capacity curve according to an embodiment of the present disclosure.

In an embodiment, referring to FIG. 3, the multiple wave crests are identified in the voltage differential-capacity curve, and the first height and the first width between each wave crest and the adjacent wave trough on the left, and the second height and the second width between each wave crest and the adjacent wave trough on the right are calculated. The first height is a difference value of the voltage differential between each wave crest and the adjacent wave trough on the left, and the first width is a difference value of the capacity between each wave crest and the adjacent wave trough on the left. The second height is an absolute value of the difference value of the voltage differential between each wave crest and the adjacent wave trough on the right, and the second width is an absolute value of the difference value of the capacity between each wave crest and the adjacent wave trough on the right.

Then, the determination index for each wave crest is calculated according to the first height, the first width, the second height, and the second width. A sum of the ratios of the perimeters to the areas of the left and right half-edge peaks of each wave crest is taken into the determination index. In an embodiment, the determination index is shown as $p=2(h1+w1)/(h1 \cdot w1)+2(h2+w2)/(h2 \cdot w2)$, $h1$ represents the first height, $w1$ represents the first width, $h2$ represents the second height, and $w2$ represents the second width. After the determination index is calculated for each wave crest, a wave crest with a minimum determination index is used as the feature peak and is used for determining the voltage knee point.

In some embodiments, in order to reduce the errors, before the voltage-capacity curve is subjected to differentiation, the method further includes performing smoothing filtering on the voltage-capacity curve. After the voltage knee point is determined, the actual capacity of the battery can be estimated according to the mode described above.

According to this embodiment of the present disclosure, the voltage-capacity curve is detected and analyzed in real time in the battery charging process, the battery does not need to be subjected to deep discharge, the using habit of the user is met, and the method has great technical advantages and market value. In the calculation process, the initial SOC of the battery does not need to be determined, the absolute value of the SOC is not involved, and the actual capacity of the battery can be calculated only by identifying the voltage knee point in the charging process, so that the estimation accuracy of the actual capacity of the battery is improved. Further, the SOH of the battery can be obtained, and the estimation accuracy and speed of the SOH are improved. Moreover, when the voltage knee point is identified, automatic identification is realized by using the perimeter/area feature, and threshold setting does not need to be manually carried out according to different vehicle types and different aging degrees, so that the universality is improved.

Figure 4:
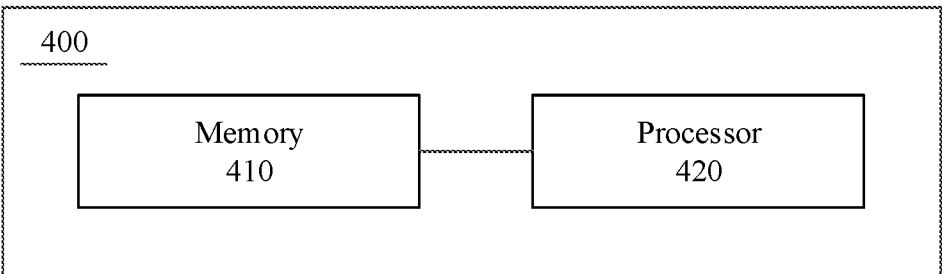
FIG. 4 is a schematic block diagram of a battery capacity estimation apparatus according to an embodiment of the present disclosure.

An embodiment of the present disclosure further provides a battery capacity estimation apparatus. The apparatus can be configured to implement the abovementioned battery capacity estimation method. Referring to FIG. 4, FIG. 4 is a schematic block diagram of a battery capacity estimation apparatus 400 according to an embodiment of the present disclosure.

As shown in FIG. 4, the battery capacity estimation apparatus 400 includes a memory 410, a processor 420, and a computer program stored in the memory 410 and operated with the processor 420. The processor 420 can implement the battery capacity estimation method as described above when executing the computer program. The processor 420 can be implemented by software, hardware, firmware or a combination thereof, and can utilize at least one of a circuit, a single or multiple Application Specific Integrated Circuits (ASIC), a Digital Signal Processor (DSP), a Digital Signal Processing Device (DSPD), a Programmable Logic Device (PLD), a Field Programmable Gate Array (FPGA), a Central Processing Unit (CPU), a controller, a micro-controller, and a microprocessor, so that the apparatus can execute part or all of the steps or any combination of the steps of the battery capacity estimation method in each embodiment of the present disclosure.

An embodiment of the present disclosure further provides a non-transitory computer-readable storage medium, a computer program is stored in the non-transitory computer-readable storage medium, and the computer program can be executed to implement the battery capacity estimation method according to this embodiment of the present disclosure.

According to this embodiment of the present disclosure, the battery capacity estimation apparatus 400 and the computer storage medium are configured to implement the above mentioned battery capacity estimation method, and therefore the battery capacity estimation device and the non-transitory computer-readable storage medium have similar advantages.

Although some embodiments have been described with reference to accompanying drawings, it should be understood that the above embodiments are only illustrative, and not to limit the scope of the present disclosure thereto. Various changes and modifications can be made by a person of ordinary skill in the art without departing from the scope and spirit of the present disclosure. All these changes and modifications are to be embraced in the scope of the present disclosure as defined in the appended claims.

A person of ordinary skill in the art may notice that the units and algorithm steps described with reference to the embodiments disclosed in this specification can be implemented in electronic hardware, or a combination of computer software and electronic hardware. Whether the functions are executed in a mode of hardware or software depends on particular applications and design constraint conditions of the technical solutions. A person skilled in the art can use different methods to implement the described functions for each particular application, but it should not be considered that the implementation goes beyond the scope of the embodiments of the present disclosure.

In the several embodiments provided in the present disclosure, it should be understood that the disclosed device and method may be implemented in other manners. For example, the described device embodiment is merely an example. For example, the unit division is merely a logical function division and may be other division during actual implementation. For example, multiple units or components may be combined or integrated into another system, or some features may be ignored or not performed.

Numerous details are set forth in the specification provided herein. However, it can be understood that, the embodiments of the present disclosure may be practiced without the details. In some examples, known methods, structures, and technologies are not disclosed in detail, so as not to mix up understanding on the specification.

Similarly, it should be understood that to simplify the present disclosure and help to understand one or more of disclosure aspects, in the descriptions of the some embodiments of the present disclosure, features of the present disclosure are sometimes grouped into a single embodiment or figure, or descriptions thereof. However, the method of the present disclosure should not be interpreted as reflecting the following intent: The present disclosure requires more features to be protected than those explicitly stated in each claim. More definitely, as reflected in the corresponding claims, the inventiveness of the disclosure lies in resolving the corresponding technical problem using features less than all features of a single embodiment disclosed above. Therefore, the claims following the implementation are hereby expressly incorporated into the implementation, with each claim standing on its own as a separate embodiment of the present disclosure.

A person skilled in the art may understand that, all features disclosed in this specification (including the accompanying claims, abstract and drawings), and all processes or units of any method or device disclosed herein may be combined in any combination, unless features are mutually exclusive. Unless otherwise explicitly stated, each feature disclosed in this specification (including the accompanying claims, abstract and drawings) may be replaced with an feature serving the same, equivalent or similar purpose.

In addition, a person skilled in the art can understand that, although some embodiments herein include some but not other features included in other embodiments, combinations of features of different embodiments are meant to be within the scope of the present disclosure and to form different embodiments. For example, in the claims, any one of the claimed embodiments may be used in any combination.

All component embodiments of the present disclosure can be implemented through hardware, or software modules running on one or more processors, or a combination thereof. Those skilled in the art should understand that some or all of the functions of some modules according to embodiments of the present disclosure can be implemented in practice using the microprocessor or the DSP. The present disclosure can also be implemented as an apparatus program (e.g., a computer program and a computer program product) for executing a part or all of the methods described herein. Such a program implementing the present disclosure can be stored in the computer readable medium, or can be in a form of one or more signals. Such signals can be downloaded from an Internet website, or provided on a carrier signal, or provided in any other form.

It is be noted that the above-mentioned embodiments illustrate rather than limit the present disclosure, and those skilled in the art may devise embodiments without departing from the scope of the appended claims. In the claims, any reference signs placed between parentheses shall not be construed as limiting the claims. The present disclosure can be implemented by way of hardware including several different elements and an appropriately programmed computer. In the unit claims enumerating several apparatuses, several of these apparatuses can be embodied by the same item of hardware. The use of the words such as "first", "second", "third", and the like does not denote any order. These words can be interpreted as names.

The foregoing descriptions are merely a implementation of the present disclosure, but are not to limit the protection scope of the present disclosure. Any variation or replacement readily figured out by those skilled in the art within the technical scope disclosed in the present disclosure shall fall within the protection scope of the present disclosure. Therefore, the protection scope of the present disclosure shall be subject to the protection scope of the claims.

What is claimed is:

1. A method of obtaining battery capacity, comprising:
acquiring a voltage-capacity curve of a battery in a battery charging process;
performing differentiation on the voltage-capacity curve to obtain a voltage differential-capacity curve;
identifying a plurality of wave crests in the voltage differential-capacity curve;
for each of the wave crests, calculating a first height and a first width between the wave crest and an adjacent wave trough on the left, and calculating a second height and a second width between the wave crest and an adjacent wave trough on the right;
calculating a determination index p according to the first height, the first width, the second height, and the second width, wherein $p=2(h1+w1)/(h1\cdot w1)+2(h2+w2)/(h2\cdot w2)$, where h1 represents the first height, w1 represents the first width, h2 represents the second height, and w2 represents the second width;
determining a voltage knee point in the voltage-capacity curve according to a wave crest with a minimum determination index;
acquiring a reference capacity value corresponding to the voltage knee point in the voltage-capacity curve;
after the battery reaches a full-charge state, acquiring charging electric energy of the battery for charging from the voltage knee point to the full-charge state; and
obtaining a capacity of the battery based on a sum of the reference capacity value and the charging electric energy.

2. The method according to claim 1, before the performing differentiation on the voltage-capacity curve, the method further comprising performing smoothing filtering on the voltage-capacity curve.

3. The method according to claim 1, wherein the reference capacity value is calibrated by:
after discharging the battery to empty, performing constant-current charging process until the battery reaching the full-charge state,
recording a voltage-capacity curve of the battery in the constant-current charging process, and
calibrating the reference capacity value according to the voltage-capacity curve of the battery in the constant-current charging process.

4. The method according to claim 1, wherein the acquiring charging electric energy of the battery for charging from the voltage knee point to the full-charge state comprises:
recording a charging time for charging the battery from the voltage knee point to the full-charge state; and
calculating the charging electric energy according to the charging time and a charging current.

5. The method according to claim 1, further comprising:
obtaining a state of health of the battery according to the capacity of the battery and an initial capacity of the battery.

6. The method according to claim 1, wherein the battery is a lithium iron phosphate battery.

7. The method according to claim 5, wherein the initial capacity of the battery is determined by:

after discharging the battery to empty, performing constant-current charging process until the battery reaching the full-charge state; and recording the initial capacity of the battery.

8. The method according to claim 5, wherein the state of health of the battery according to the capacity of the battery and the initial capacity of the battery is obtained according to:

SOH=$Q/Q_{new}$*100%, wherein SOH represents the state of health of the battery, Q represents the capacity of the battery, $Q_{new}$ represents the initial capacity of the battery.

9. An apparatus of obtaining battery capacity, comprising a memory and a processor, wherein the memory stores a computer program executable by the processor, and the processor is configured to execute the computer program to perform operations comprising:

acquiring a voltage-capacity curve of a battery in a battery charging process;

performing differentiation on the voltage-capacity curve to obtain a voltage differential-capacity curve;

identifying a plurality of wave crests in the voltage differential-capacity curve;

for each of the wave crests, calculating a first height and a first width between the wave crest and an adjacent wave trough on the left, and calculating a second height and a second width between the wave crest and an adjacent wave trough on the right;

calculating a determination index p according to the first height, the first width, the second height, and the second width, wherein p=$2(h1+w1)/(h1 \cdot w1)+2(h2+w2)/(h2 \cdot w2)$, where h1 represents the first height, w1 represents the first width, h2 represents the second height, and w2 represents the second width;

determining a voltage knee point in the voltage-capacity curve according to a wave crest with a minimum determination index;

acquiring a reference capacity value corresponding to the voltage knee point in the voltage-capacity curve;

after the battery reaches a full-charge state, acquiring charging electric energy of the battery for charging from the voltage knee point to the full-charge state; and obtaining a capacity of the battery based on a sum of the reference capacity value and the charging electric energy.

10. The apparatus according to claim 9, wherein before the performing differentiation on the voltage-capacity curve, the operations further comprise: performing smoothing filtering on the voltage-capacity curve.

11. The apparatus according to claim 9, wherein the reference capacity value is calibrated by:

after discharging the battery to empty, performing constant-current charging process until the battery reaching the full-charge state, recording a voltage-capacity curve of the battery in the constant-current charging process, and calibrating the reference capacity value according to the voltage-capacity curve of the battery in the constant-current charging process.

12. The apparatus according to claim 9, wherein the acquiring charging electric energy of the battery for charging from the voltage knee point to the full-charge state comprises:

recording a charging time for charging the battery from the voltage knee point to the full-charge state; and calculating the charging electric energy according to the charging time and a charging current.

13. The apparatus according to claim 9, wherein the operations further comprise:

obtaining a state of health of the battery according to the capacity of the battery and an initial capacity of the battery.

14. The apparatus according to claim 9, wherein the battery is a lithium iron phosphate battery.

15. A non-transitory computer-readable storage medium storing a computer program, which when executed by a processor, causes the processor to perform operations comprising:

acquiring a voltage-capacity curve of a battery in a battery charging process;

performing differentiation on the voltage-capacity curve to obtain a voltage differential-capacity curve;

identifying a plurality of wave crests in the voltage differential-capacity curve;

for each of the wave crests, calculating a first height and a first width between the wave crest and an adjacent wave trough on the left, and calculating a second height and a second width between the wave crest and an adjacent wave trough on the right;

calculating a determination index p according to the first height, the first width, the second height, and the second width, wherein p=$2(h1+w1)/(h1 \cdot w1)+2(h2+w2)/(h2 \cdot w2)$, where h1 represents the first height, w1 represents the first width, h2 represents the second height, and w2 represents the second width;

determining a voltage knee point in the voltage-capacity curve according to a wave crest with a minimum determination index;

acquiring a reference capacity value corresponding to the voltage knee point in the voltage-capacity curve;

after the battery reaches a full-charge state, acquiring charging electric energy of the battery for charging from the voltage knee point to the full-charge state; and obtaining a capacity of the battery based on a sum of the reference capacity value and the charging electric energy.

16. The non-transitory computer-readable storage medium according to claim 15, wherein before the performing differentiation on the voltage-capacity curve, the operations further comprise: performing smoothing filtering on the voltage-capacity curve.

17. The non-transitory computer-readable storage medium according to claim 15, wherein the reference capacity value is calibrated by:

after discharging the battery to empty, performing constant-current charging process until the battery reaching the full-charge state, recording a voltage-capacity curve of the battery in the constant-current charging process, and calibrating the reference capacity value according to the voltage-capacity curve of the battery in the constant-current charging process.

18. The non-transitory computer-readable storage medium according to claim 15, wherein the acquiring charging electric energy of the battery for charging from the voltage knee point to the full-charge state comprises:

recording a charging time for charging the battery from the voltage knee point to the full-charge state; and calculating the charging electric energy according to the charging time and a charging current.

19. The non-transitory computer-readable storage medium according to claim 15, wherein the operations further comprise:

obtaining a state of health of the battery according to the capacity of the battery and an initial capacity of the battery.

20. The non-transitory computer-readable storage medium according to claim 15, wherein the battery is a lithium iron phosphate battery.

\* \* \* \* \*